(12) United States Patent
Huang et al.

(10) Patent No.: US 11,122,677 B2
(45) Date of Patent: Sep. 14, 2021

(54) PRINTED CIRCUIT BOARD STRUCTURE AND METHOD FOR INDUCTIVE NOISE CANCELLATION

(71) Applicant: Marvell Asia Pte, Ltd., Singapore (SG)

(72) Inventors: Shaowu Huang, Sunnyvale, CA (US); Dance Wu, Palo Alto, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/949,783

(22) Filed: Nov. 13, 2020

(65) Prior Publication Data

US 2021/0153342 A1    May 20, 2021

Related U.S. Application Data

(60) Provisional application No. 62/936,244, filed on Nov. 15, 2019.

(51) Int. Cl.
*H05K 1/02* (2006.01)
*H05K 1/16* (2006.01)

(52) U.S. Cl.
CPC .......... *H05K 1/0228* (2013.01); *H05K 1/162* (2013.01); *H05K 1/165* (2013.01)

(58) Field of Classification Search
CPC ....... H05K 1/0228; H05K 1/162; H05K 1/165
See application file for complete search history.

(56) References Cited

U.S. PATENT DOCUMENTS

| 5,700,167 A | 12/1997 | Pharney et al. | |
| 7,314,393 B2* | 1/2008 | Hashim | H01R 13/6469 |
| | | | 439/676 |
| 2005/0254223 A1* | 11/2005 | Hashim | H01R 13/6469 |
| | | | 361/793 |
| 2006/0160428 A1* | 7/2006 | Hashim | H01R 13/6467 |
| | | | 439/676 |
| 2010/0041274 A1* | 2/2010 | Marti | H01R 13/6594 |
| | | | 439/607.01 |
| 2010/0291795 A1* | 11/2010 | Gibson | H05K 1/024 |
| | | | 439/540.1 |
| 2013/0057379 A1* | 3/2013 | Klein | H01F 17/0033 |
| | | | 336/200 |
| 2016/0028358 A1* | 1/2016 | Yosui | H01F 17/00 |
| | | | 333/185 |

FOREIGN PATENT DOCUMENTS

GB        2 380 334        4/2003

* cited by examiner

*Primary Examiner* — Hoa C Nguyen

(57) ABSTRACT

A printed circuit board (PCB) for coupling to an automotive Ethernet connection includes first and second board conduction traces, a first off-board conductor coupled to the first trace at a first contact point spaced from an edge of the PCB, and extending over the PCB from the first contact point to the edge for connection a first off-board conduction path, a second off-board conductor coupled, adjacent to the first off-board conduction path, to the second trace at a second contact point spaced from the edge of the PCB, and extending over the PCB from the second contact point to the edge for connection the second off-board conduction path. The off-board paths are a power path and a signal path. A loop in one of board conduction traces inductively couples that one the board conduction traces to a respective one of off-board conduction paths.

21 Claims, 5 Drawing Sheets

PRINTED CIRCUIT BOARD STRUCTURE AND METHOD FOR INDUCTIVE NOISE CANCELLATION

CROSS REFERENCE TO RELATED APPLICATION

This disclosure claims the benefit of copending, commonly-assigned U.S. Provisional Patent Application No. 62/936,244, filed Nov. 15, 2019, which is hereby incorporated by reference herein in its entirety.

FIELD OF USE

This disclosure relates to a printed circuit board (PCB) having multiple adjacent input/output conduction paths. More particularly this disclosure relates to a printed circuit board using inductive techniques to cancel interference between multiple adjacent input/output conduction paths.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Printed circuit boards in many applications include connections to circuits off the printed circuit board itself. In some of those applications, especially in physically small implementations, two or more off-board connections may be close enough that one off-board connection may cause interference or cross-talk with the other off-board connection. The interference may be especially acute when a power connection is close to a data connection, and this problem may be exacerbated by form factor constraints, such as when all connections must be made using a single connector.

SUMMARY

According to implementations of the subject matter of this disclosure, a printed circuit board, configured to be coupled to an automotive Ethernet connection having a first off-board conduction path and a second off-board conduction path, includes a first board conduction trace, a first off-board conductor coupled to the first board conduction trace at a first contact point spaced from an edge of the printed circuit board, and extending over the printed circuit board from the first contact point to the edge of the printed circuit board for connection the first off-board conduction path, a second board conduction trace, a second off-board conductor coupled, adjacent to the first off-board conduction path, to the second board conduction trace at a second contact point spaced from the edge of the printed circuit board, and extending over the printed circuit board from the second contact point to the edge of the printed circuit board for connection the second off-board conduction path. One path of (1) the second off-board conduction path, and (2) the first off-board conduction path, is a power path and another path of (1) the second off-board conduction path, and (2) the first off-board conduction path, is a signal path. At least one loop in at least one of (a) the first board conduction trace, and (b) the second board conduction trace, is configured to inductively couple the respective one of (a) the first board conduction trace and (b) the second board conduction trace to a respective one of (1) the second off-board conduction path and (2) the first off-board conduction path.

In a first implementation of such a printed circuit board, the respective one of (1) the second off-board conduction path, and (2) the first off-board conduction path, may cross the at least one loop in two places.

In an instance of that first implementation, the respective one of (1) the second off-board conduction path, and (2) the first off-board conduction path, may cross a center of the at least one loop.

In a second implementation of such a printed circuit board, the at least one loop includes a plurality of loops.

In a third implementation of such a printed circuit board, the at least one loop may be between (A) a respective one of (i) the first contact point and (ii) the second contact point, and (B) the edge of the printed circuit board.

In a fourth implementation of such a printed circuit board, the signal path may be a differential signal path.

In an instance of that fourth implementation, current in the at least one loop may flow oppositely to a direction of current flow in a loop formed by legs of the differential signal path.

In a fifth implementation of such a printed circuit board, the at least one of (a) the first board conduction trace, and (b) the second board conduction trace, having the at least one loop may be a respective one of (a) the first board conduction trace, and (b) the second board conduction trace.

In an instance of that fifth implementation, a first circuit including a first one of (1) the second off-board conduction path, and (2) the first off-board conduction path, may be less sensitive to latency than another circuit including another one of (1) the second off-board conduction path, and (2) the first off-board conduction path; and the respective one of (a) the first board conduction trace, and (b) the second board conduction trace, having the at least one loop may be the one of (a) the first board conduction trace, and (b) the second board conduction trace, that is coupled to the first circuit.

In a sixth implementation of such a printed circuit board, the at least one of (a) the first board conduction trace, and (b) the second board conduction trace, having the at least one loop may include both (a) the first board conduction trace, and (b) the second board conduction trace, and the at least one loop may include a first at least partial loop in the first board conduction trace and a second at least partial loop in the second board conduction trace.

A method according to implementations of the subject matter of this disclosure for configuring a printed circuit board for coupling to an automotive Ethernet connection having a first off-board conduction path and a second off-board conduction path, to mitigate interference between (i) the first off-board conduction path comprising a first off-board conductor coupled to the first board conduction trace at a first contact point spaced from an edge of the printed circuit board and extending over the printed circuit board from the first contact point to the edge of the printed circuit board, and (ii) the second off-board conduction path, including a second off-board conductor coupled, adjacent to the first off-board conduction path, to a second board conduction trace at a second contact point spaced from an edge of the printed circuit board and extending over the printed circuit board from the second contact point to the edge of the printed circuit board, wherein one path of (1) the second off-board conduction path, and (2) the first off-board conduction path, is a power path and another path of (1) the second off-board conduction path, and (2) the first off-board conduction path, is a signal path, includes configuring at least one loop to inductively couple a respective one of (a) the first board conduction trace, and (b) the second board conduction trace, to a respective one of (1) the second off-board conduction path, and (2) the first off-board conduction path, and forming the configured at least one loop on the printed circuit board in at least one of (a) the first board conduction trace and (b) the second board conduction trace.

In a first implementation of such a method, configuring the at least one loop may include configuring the loop so that the respective one of (1) the second off-board conduction path, and (2) the first off-board conduction path, crosses the at least one loop in two places.

In an instance of the first implementation, configuring the at least one loop may include configuring the at least one loop so that the respective one of (1) the second off-board conduction path, and (2) the first off-board conduction path, crosses a center of the at least one loop.

In a second implementation of such a method, forming the at least one loop may include forming a plurality of loops.

In a third implementation of such a method, forming the at least one loop may include forming the at least one loop between (A) a respective one of (i) the first contact point and (ii) the second contact point, and (B) the edge of the printed circuit board.

In a fourth implementation of such a method, forming the at least one loop in the at least one of (a) the first board conduction trace, and (b) the second board conduction trace, may include forming the at least one loop in a respective one of (a) the first board conduction trace, and (b) the second board conduction trace.

In a first instance of that fourth implementation, a first circuit including a first one of (1) the second off-board conduction path, and (2) the first off-board conduction path, may be less sensitive to latency than another circuit including another one of (1) the second off-board conduction path and (2) the first off-board conduction path, and forming the at least one loop in the respective one of (a) the first board conduction trace, and (b) the second board conduction trace, may include forming the at least one loop in the one of (a) the first board conduction trace, and (b) the second board conduction trace, that is coupled to the first circuit.

In variant of that first instance of the fourth implementation, forming the at least one loop in the respective one of (a) the first board conduction trace, and (b) the second board conduction trace, may include forming the at least one loop in the power path.

In a fifth implementation of such a method, forming the at least one loop in at least one of (a) the first board conduction trace, and (b) the second board conduction trace, may include forming both (a) a first at least partial loop in the first board conduction trace, and (b) a second at least partial loop in the second board conduction trace.

In a sixth implementation of such a method, at least the respective one of (1) the second off-board conduction path, and (2) the first off-board conduction path, may be a differential conduction path, and forming the at least one loop may include forming a loop in which current flows oppositely to a direction of current flow in a loop formed by legs of the differential conduction path.

According to implementations of the subject matter of this disclosure, an integrated circuit package configured to be coupled to an automotive Ethernet connection having a first off-package conduction path and a second off-package conduction path, includes a substrate, a first package conduction trace on the substrate, a first off-package conductor coupled to the first package conduction trace at a first contact point spaced from an edge of the substrate, and extending over the substrate from the first contact point to the edge of the substrate for connection the first off-package conduction path, a second package conduction trace, and a second off-package conductor coupled, adjacent to the first off-package conduction path, to the second package conduction trace at a second contact point spaced from the edge of the substrate, and extending over the substrate from the second contact point to the edge of the substrate for connection the second off-package conduction path. One path of (1) the second off-package conduction path, and (2) the first off-package conduction path, is a power path and another path of (1) the second off-package conduction path, and (2) the first off-package conduction path, is a signal path. At least one loop in at least one of (a) the first package conduction trace, and (b) the second package conduction trace, is configured to inductively couple the respective one of (a) the first package conduction trace and (b) the second package conduction trace to a respective one of (1) the second off-package conduction path and (2) the first off-package conduction path.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
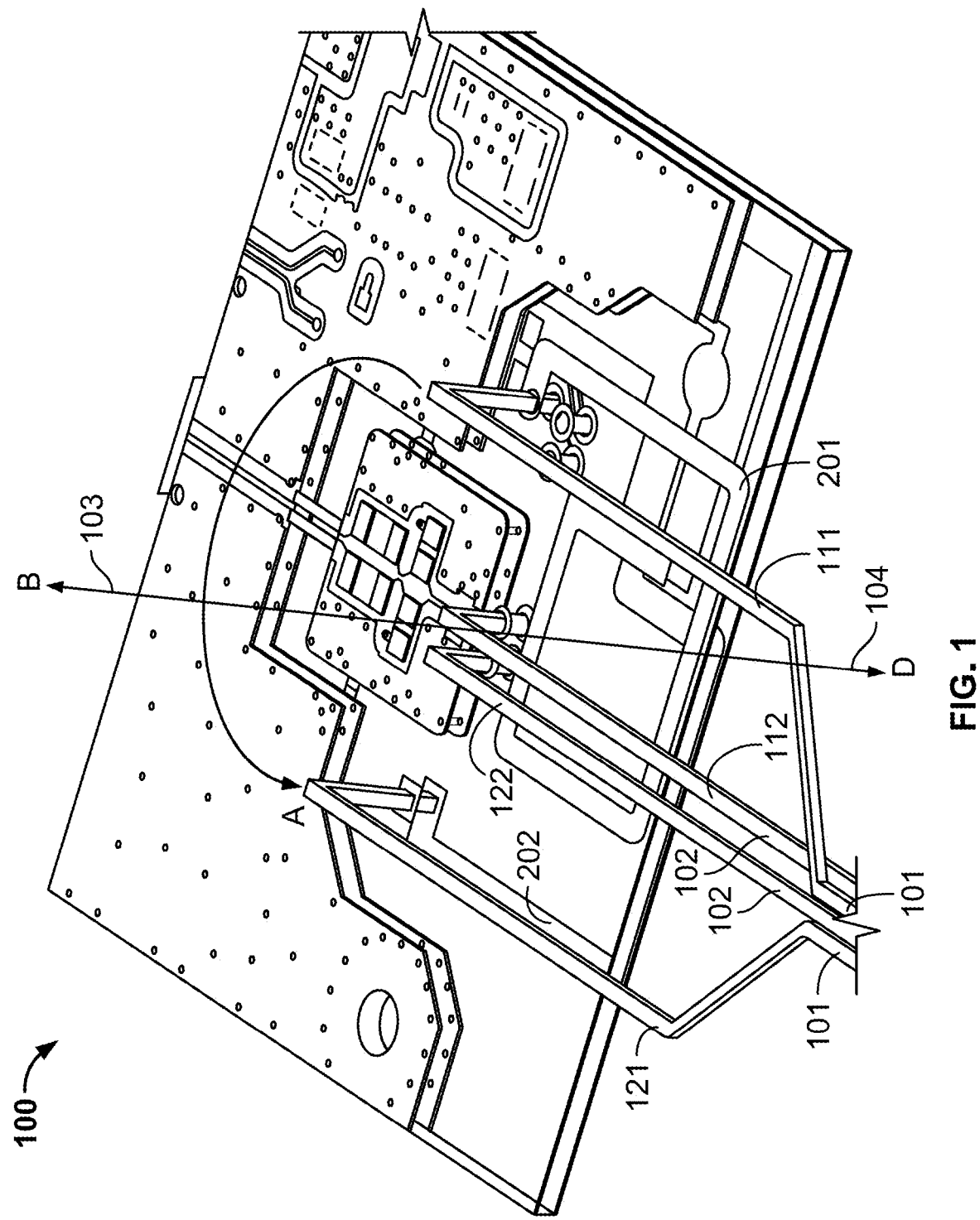
FIG. 1 is a perspective view of a portion of a printed circuit board incorporating a first implementation of the subject matter of this disclosure.

As noted above, printed circuit boards in many applications include connections to circuits off the printed circuit board itself. In some of those applications, especially in physically small implementations, two or more off-board connections may be close enough that one off-board connection may cause interference or cross-talk with the other off-board connection. For example, in automotive Ethernet applications, an automotive Ethernet transceiver is used at either end of an automotive Ethernet link between different parts of a vehicle. Because space may be at a premium, the automotive Ethernet transceiver in some locations may be mounted on small printed circuit boards, without room to space off-board connections from each other.

In particular, each automotive Ethernet transceiver normally requires a power connection and at least one data connection. If those two connections are near each other, as may be necessary in the limited spaces available in a vehicle, where a single connector is used to connect all wires to the printed circuit board, current flow on one connection may generate an electromagnetic field that causes interference on the other connection, through, e.g., predominantly inductive coupling due to magnetic field interference in near field region. For example, the current on the power connection may interfere with signals on the data connection. However, it also is possible, if there are two or more data connections, for the current in one data connection to interfere with another data connection.

As one example, in the case of a power connection interfering with a data connection, if power current flows in on one lead parallel to the board surface and out on another lead parallel to the board surface, a magnetic field perpendicular to the board surface will be generated (the specific direction of the magnetic field vector—toward or away from the board surface—is determined by the current flow direction according to the "right-hand rule"). If the data connection is in the area bounded by the power leads, that magnetic field could interfere with data signals, whether the data connection is a differential connection with two data leads, or a single-ended connection with a return path through the power connection ground lead. Moreover, while relative current magnitudes make it unlikely that a data signal could generate a strong enough magnetic field to affect power current, fluctuations in power current such as electrical fast transient current, if they did occur and were large enough, could interfere with operation of the automotive Ethernet transceiver on the printed circuit board.

As another example, if two data connections were near each other, and not near any power connection whose contribution to interference would likely dwarf any interference caused by a data signal, one data signal may generate a sufficient magnetic field to interfere with the other data signal, particularly if at least the interfering data connection were a differential connection with separate leads carrying signal current in opposite directions.

Therefore, in accordance with implementations of the subject matter of this disclosure, one or more loops are formed on the printed circuit board in the on-board conduction trace that is coupled to the off-board connection that causes the interference. In such an implementation, the loop may be configured and positioned to generate a magnetic field in a direction opposite to the magnetic field generated by current flowing in the off-board connection. In particular, the loop may be configured so that the inbound current flow from the off-board connection doubles back on itself once on the printed circuit board, and then crosses over and flows adjacent to the outbound current flow but in the opposite direction (or first crosses over to flow adjacent the outbound current flow and then doubles back along the inbound current flow). As a result, current flowing in the loop creates a magnetic field contribution opposite to the magnetic field contribution from the current flowing in through the off-board connection and then out onto the off-board connection.

In order for the magnetic field contribution from the loop to counteract the interference caused by the off-board connection, the loop is positioned on the board so that the conductor in which the interference is generated crosses the loop. For better results, the loop is positioned on the board so that the conductor in which the interference is generated crosses near the center of the loop.

In some implementations, more than one loop may be formed. For example, loops may be formed on both surfaces of the printed circuit board, with the loop on the surface remote from the off-board conductor connected to the loop on the same surface as the off-board conductor by vias through the printed circuit board. Alternatively, the printed circuit board may be a multi-level board with one or more metal layers sandwiched between substrate layers, with the loops in different layers connected by vias.

Separately from the number of loops, any individual loop may be formed entirely in one leg of conduction path—i.e., entirely in the inbound leg or entirely in the outbound leg, or partially in the inbound leg and partially in the outbound leg.

Adding one or more loops to a conduction path in accordance with the subject matter of this disclosure lengthens that conduction path. Therefore, if there is a choice as to which conduction path a loop should be added to, it may be appropriate to add the loop to the conduction path that would be less affected by latency, if there is such a path. Thus, in an embodiment where one conduction path is a power path and the other conduction path is a data path, the power path is less likely to be affected by latency, and the loop probably would be added to the power path. On the other hand, if both conduction paths are data paths, then it is more likely that both conduction paths would be affected by latency and there may be less of a latency advantage to forming the loop in one conduction path over the other. Nevertheless, where both conduction paths may be affected by latency, it still may make sense to form the loop in the conduction path that is less sensitive to latency.

Insofar as a magnetic field that interferes with signals on a first off-board conductor is formed by a second, interfering off-board conductor where the path of the interfering conductor loops around the first conductor, the interference necessarily occurs before the off-board conductor is coupled to the surface of the printed circuit board. In order to form a compensating loop, in accordance with the subject matter of this disclosure, on the printed circuit board and adjacent the first off-board conductor, the loop is formed between an edge of the printed circuit board and a contact point, spaced away from the edge, at which the first off-board conductor is coupled to the printed circuit board. If the first off-board conductor is coupled to the printed circuit board too close to the edge of the printed circuit board, it may not be possible to form a compensating loop in accordance with the subject matter of this disclosure.

The subject matter of this disclosure may be better understood by reference to FIGS. 1-5.

FIG. 1 shows a portion of a printed circuit board 100 with two off-board conduction paths 101, 102. In an automotive Ethernet implementation, various automotive sensors, transducers or actuators in locations throughout a vehicle may be interconnected by an automotive Ethernet network. At least some of the various sensors, transducers or actuators may be located in confined spaces—e.g., inside a vehicle door—where space constraints dictate that one multi-conductor cable carries all connections, through a single connector, to printed circuit board 100. In such an implementation, conduction path 101 may be a power path having positive leg 111 (e.g., the "battery" lead in an automotive application) and negative leg 121 (e.g., the ground lead in an automotive application), while conduction path 102 may be a signal path. As shown, conduction path 102 may be a differential signal path having two legs 112, 122, although conduction path 102 also may be a single-ended signal path where return signal current flows through the power ground lead (e.g., leg 121), in which case the second lead, carrying leg 122, may be omitted. The off-board portions of conduction paths 101, 102 are shown as being parallel, consistent with being connected to the automotive Ethernet network through a single connector (not shown and located out of the view of FIG. 1).

Current flow in conduction path 101 would follow a path through circuitry on printed circuit board 100, but in the absence of the subject matter of this invention would, in gross, effectively follow the path indicated by arrow A, generating a magnetic field 103 represented by arrow B.

Arrow B is a vector representation, showing the magnetic field 103 extending out of the plane of printed circuit board 100 in the direction determined by the "right-hand rule." This magnetic field 103 could generate interference in conduction path 102, whether conduction path 102 were differential (as shown) or single-ended (not shown). Conduction path 101 is more likely to be a power path than another signal path, insofar as interference generated by a power path is likely to be stronger, and therefore more disruptive, than interference generated by a signal path, but conduction path 101 could also be another signal path. However, while conduction path 102 may be differential or single-ended, if conduction path 101 were single-ended, with its return path located elsewhere, it would be much less likely to generate an interfering magnetic field, if at all.

In accordance with implementations of the subject matter of this disclosure, the effects of magnetic field 103, including any interference that magnetic field 103 may cause, may be mitigated (i.e., reduced or eliminated) by forming one or more loops on printed circuit board 100 coupled to conduction path 101 in the same vicinity as magnetic field 103, and configuring that loop or those loops so that current flows in a direction opposite to arrow A, thereby generating a separate magnetic field in a direction opposite to arrow B, to counteract the interfering effects of magnetic field 103.

Figure 2:
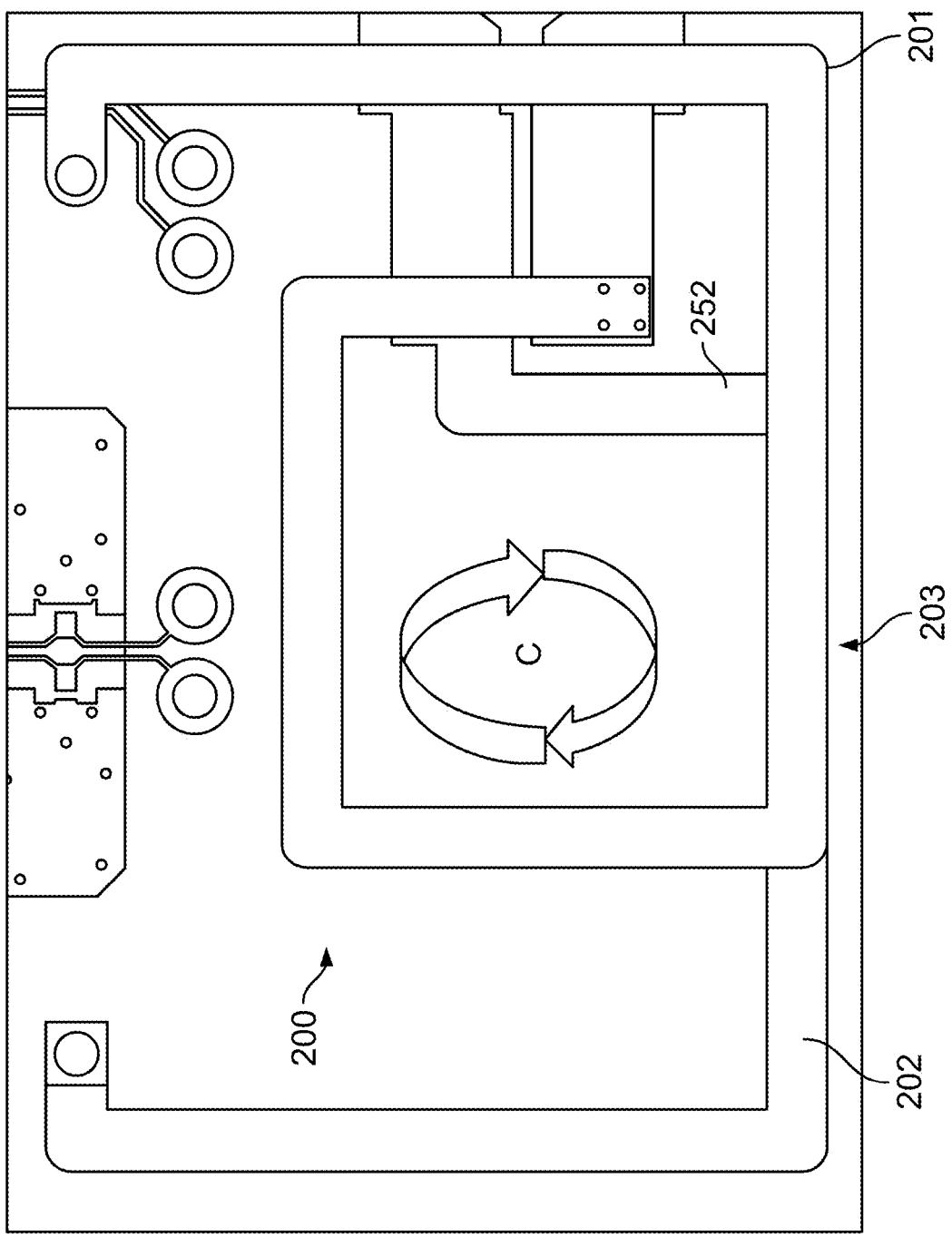
FIG. 2 is a plan view of a portion of FIG. 1.

As seen in FIG. 1 and in more detail in FIG. 2, a loop 200 may be formed by routing printed circuit conduction trace 201 of positive power leg 111, and printed circuit conduction trace 202 of negative power leg 121 around the area where magnetic field 103 would be formed. In this implementation, a single loop 203 is formed partially from printed circuit conduction trace 201 (which contributes most of loop 203) and partially from printed circuit conduction trace 202. The direction of current flow in loop 203 is in the direction of arrows C, thereby generating magnetic field 104 in the direction (based on the right-hand rule) of arrow D, opposite to the direction of arrow B, and thereby counteracting, magnetic field 103.

It is noted that the particular portion of loop 203 that is formed by each of the conduction traces 201, 202 is only an illustration. Other factors, such as board layout considerations, may determine the precise portion of loop 203 that is formed by each of the conduction traces 201, 202, which would not be expected to affect magnetic field 104 generated by loop 203 insofar as the current in each leg 111, 121 of conduction path 101 should be the same in the absence of unwanted leakage in the circuit elsewhere on printed circuit board 100. However, consistent with the discussion above, loop 203 is formed in the power path, rather than the signal path, because (1) the power path is more likely to cause interference in the signal path than the signal path is to cause interference in the power path, and (2) the power path is less sensitive to latency than the signal path.

Moreover, the number of loops in implementations of the subject matter of this disclosure is not limited to one loop. For example, depending on the area available for the loop or loops, more than one loop may be needed to achieve a strong enough magnetic field 104 to sufficiently counter the interfering effects of magnetic field 103.

Figure 3:
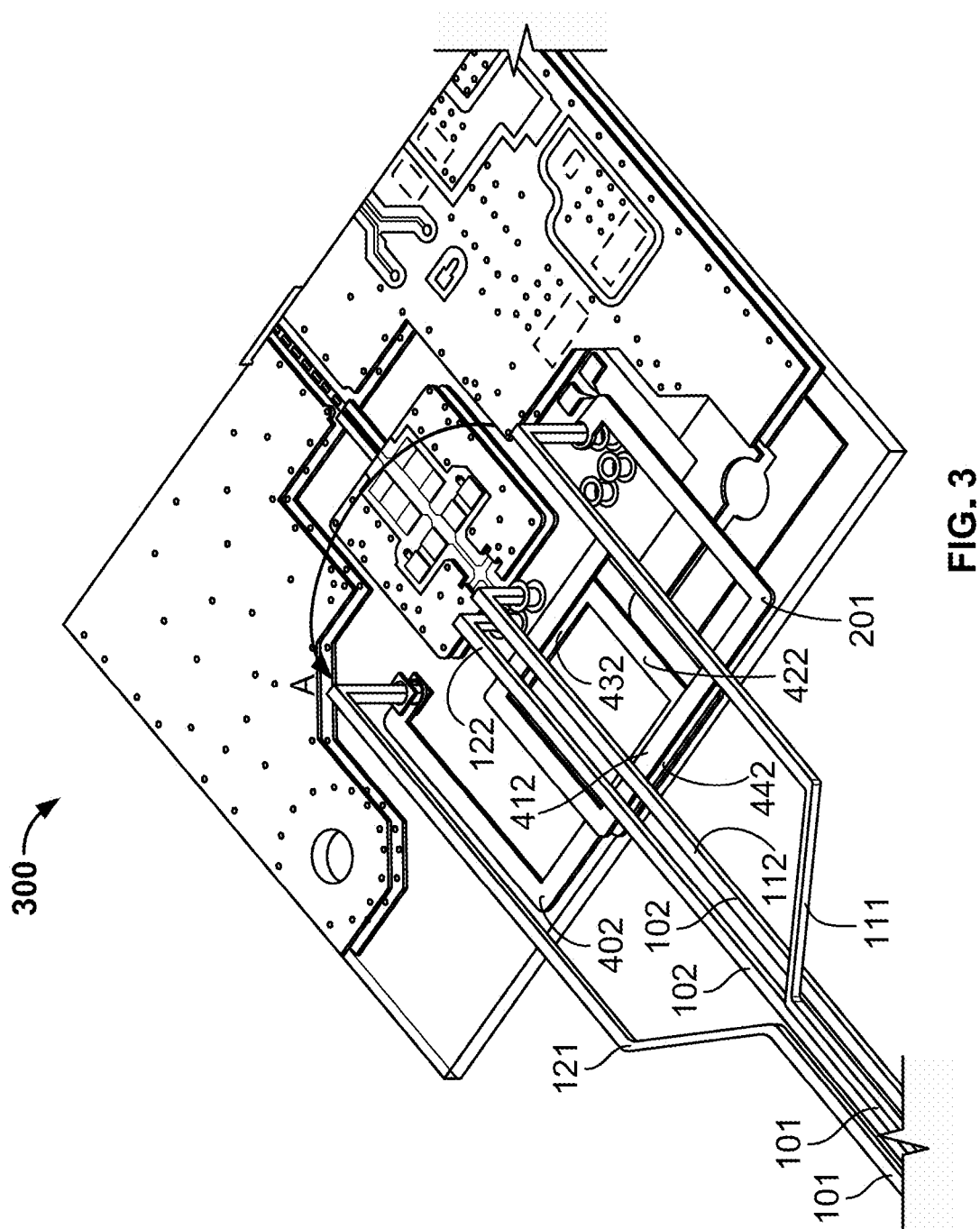
FIG. 3 is a perspective view of a portion of a printed circuit board incorporating a second implementation of the subject matter of this disclosure.
Figure 4:
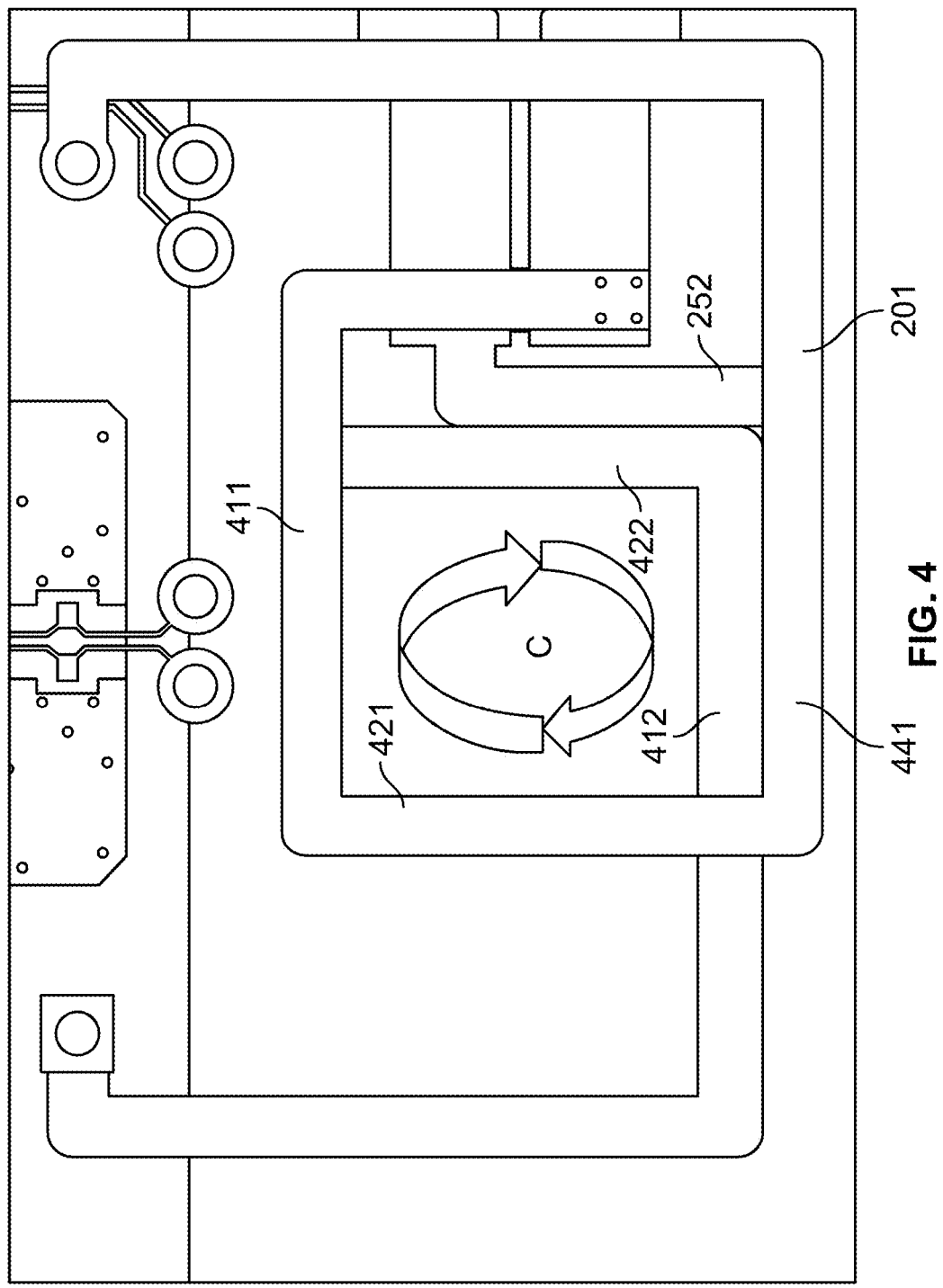
FIG. 4 is a plan view of a portion of FIG. 3.

FIGS. 3 and 4 show an implementation 300 having one additional loop (i.e., two total loops) as compared to the one-loop implementation of FIGS. 1 and 2. As can be seen by comparison to FIGS. 1 and 2, the loop portion contributed by printed circuit conduction trace 201 of positive power leg 111 is essentially unchanged in this second implementation as compared to the first implementation. However, the loop portion contributed by printed circuit conduction trace 402 of negative power leg 121 includes a full additional loop 403. Two sides 412, 422 of additional loop 403 are best seen in FIG. 4, while two other sides (one of which can be seen at 432 in FIG. 3) are located under portions 411, 421 (which form part of first loop 203) of printed circuit conduction trace 201 of positive power leg 111. A further portion 442 (seen in FIG. 3) of additional loop 403 is located under portion 441 of printed circuit conduction trace 201 of positive power leg 111, with the additional loop concluding with final portion 252 just as in printed circuit conduction trace 202 of negative power leg 121.

If there are only two loops, they can be accommodated by using opposite sides of a single-layer printed circuit board that is metallized on both surfaces, with signals conducted through the substrate from one side to the other using metal-filled vias (not shown). More than two loops can be accommodated by a multi-layer printed circuit board, in which multiple substrate layers are alternatingly stacked with multiple metal layers, again using metal-filled vias to conduct signals from one layer to another. A multi-layer printed circuit board also can accommodate a two-loop implementation.

In order for the magnetic field 104 created by a loop or loops according to implementations of the subject matter of this disclosure to be effective in mitigating interference caused by magnetic field 103, the off-board conduction path that suffers from the interference should pass within the loop or loops—i.e., the loop or loops should be placed so that the off-board conduction path that suffers from the interference should cross the loop or loops in two places. For best effect, the loop or loops should be placed so that the off-board conduction path that suffers from the interference crosses the center of the loop or loops. Even if the off-board conduction path that suffers from the interference does not cross the center of the loop or loops, the closer it passes to the center of the loop or loops, the better the loop or loops will mitigate the interference. In addition, as discussed above, in order for the off-board conduction path that suffers from the interference to cross any portion of the loop, the loop or loops 203 are formed between the edge of the printed circuit board and the point at which the off-board conduction path is coupled to the printed circuit board.

Although the subject matter of this disclosure has been described thus far in terms of a printed circuit board, the subject matter of this disclosure also may apply to integrated circuit packages including one or more integrated circuit components mounted in an electronic package with connections to circuits off the package itself. In some of those implementations, especially, as noted above, where the package is configured for use in a space-constrained application, two or more off-package connections may be close enough that one off-package connection may cause EMI or crosstalk with the other off-package connection. The representations in FIGS. 1-4 may be considered to be representations of the interior of an integrated circuit board package, with the substrate being a package substrate rather than a PCB substrate.

Figure 5:
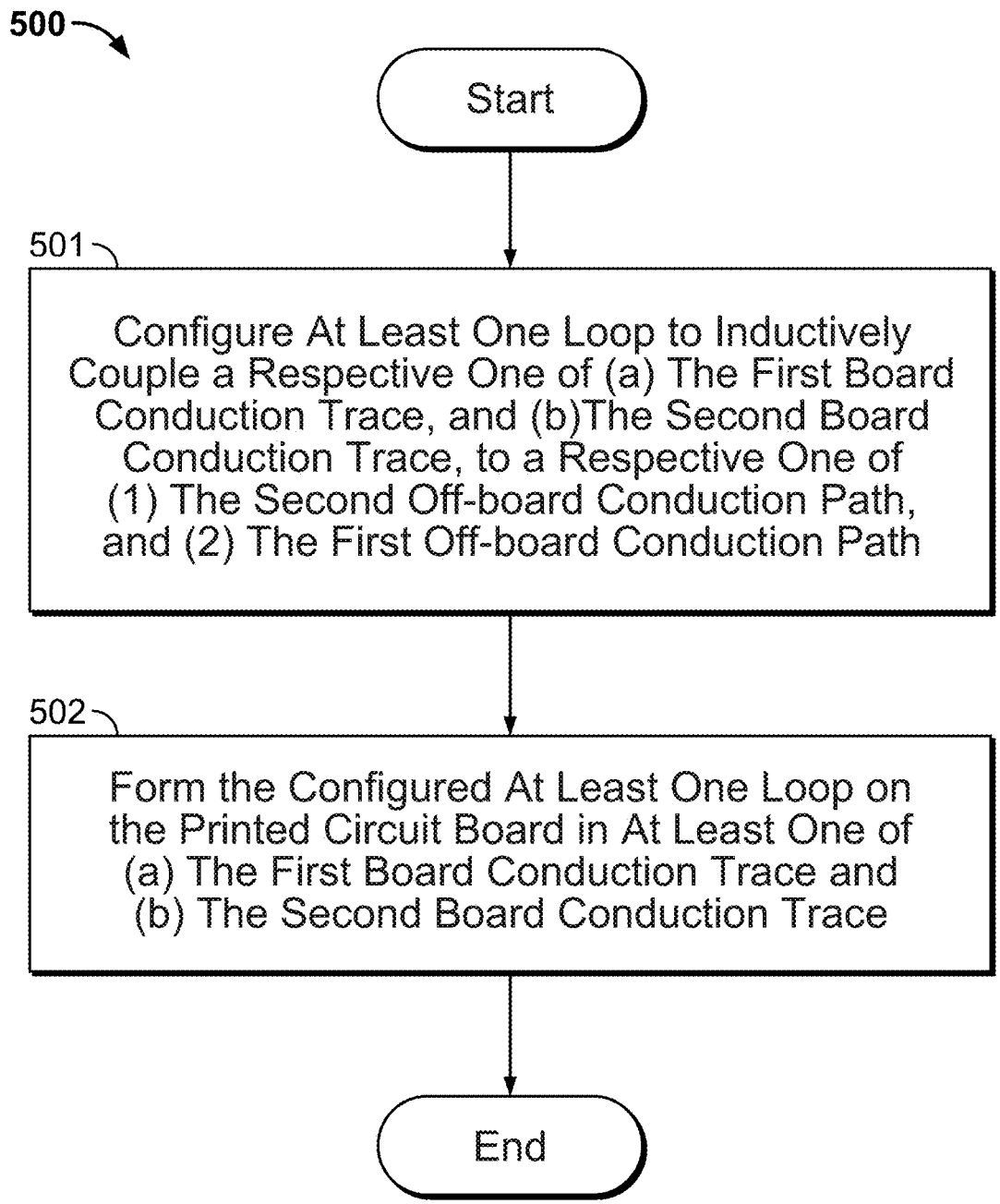
FIG. 5 is a flow diagram illustrating a method according to an implementation of the subject matter of this disclosure for forming a printed circuit board.

A method 500 according to implementations of the subject matter of this disclosure is diagrammed in FIG. 5.

Method 500 begins at 501 where at least one loop is configured to inductively couple a respective one of (a) the first board conduction trace, and (b) the second board conduction trace, to a respective one of (1) the second off-board conduction path, and (2) the first off-board conduction path. At 502, the loop (or loops), as configured at 501, is formed on the surface of the printed circuit board in at least one of (a) the first board conduction trace and (b) the second board conduction trace, with the particular trace or traces in which the loop or loops are formed being selected according to the criteria discussed above. The actual formation of the loop or loops may be performed using known printed circuit board techniques, including etching of an existing metal layer, or deposition of the traces using metal deposition techniques (e.g., sputtering). Method 500 then ends.

Thus it is seen that a printed circuit board, and a method of forming a printed circuit board, using inductive techniques to cancel interference between multiple adjacent input/output conduction paths, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A printed circuit board configured to be coupled to an automotive Ethernet connection having a first off-board conduction path and a second off-board conduction path, the printed circuit board comprising:
    a first board conduction trace;
    a first off-board conductor coupled to the first board conduction trace at a first contact point spaced from an edge of the printed circuit board, and extending over the printed circuit board from the first contact point to the edge of the printed circuit board for connection the first off-board conduction path;
    a second board conduction trace;
    a second off-board conductor coupled, adjacent to the first off-board conduction path, to the second board conduction trace at a second contact point spaced from the edge of the printed circuit board, and extending over the printed circuit board from the second contact point to the edge of the printed circuit board for connection the second off-board conduction path; wherein:
    one path of (1) the second off-board conduction path, and (2) the first off-board conduction path, is a power path and another path of (1) the second off-board conduction path, and (2) the first off-board conduction path, is a signal path; and
    at least one loop in at least one of (a) the first board conduction trace, and (b) the second board conduction trace, is configured to inductively couple the respective one of (a) the first board conduction trace and (b) the second board conduction trace to a respective one of (1) the second off-board conduction path and (2) the first off-board conduction path.

2. The printed circuit board of claim 1 wherein the respective one of (1) the second off-board conduction path, and (2) the first off-board conduction path, crosses the at least one loop in two places.

3. The printed circuit board of claim 2 wherein the respective one of (1) the second off-board conduction path, and (2) the first off-board conduction path, crosses a center of the at least one loop.

4. The printed circuit board of claim 1 wherein the at least one loop comprises a plurality of loops.

5. The printed circuit board of claim 1 wherein the at least one loop is between (A) a respective one of (i) the first contact point and (ii) the second contact point, and (B) the edge of the printed circuit board.

6. The printed circuit board of claim 1 wherein the signal path is a differential signal path.

7. The printed circuit board of claim 6 wherein current in the at least one loop flows oppositely to a direction of current flow in a loop formed by legs of the differential signal path.

8. The printed circuit board of claim 1 wherein:
    the at least one of (a) the first board conduction trace, and (b) the second board conduction trace, having the at least one loop is a respective one of (a) the first board conduction trace, and (b) the second board conduction trace.

9. The printed circuit board of claim 8 wherein:
    a first circuit including a first one of (1) the second off-board conduction path, and (2) the first off-board conduction path, is less sensitive to latency than another circuit including another one of (1) the second off-board conduction path, and (2) the first off-board conduction path; and
    the respective one of (a) the first board conduction trace, and (b) the second board conduction trace, having the at least one loop is the one of (a) the first board conduction trace, and (b) the second board conduction trace, that is coupled to the first circuit.

10. The printed circuit board of claim 1 wherein:
    the at least one of (a) the first board conduction trace, and (b) the second board conduction trace, having the at least one loop comprises both (a) the first board conduction trace, and (b) the second board conduction trace; and
    the at least one loop comprises a first at least partial loop in the first board conduction trace and a second at least partial loop in the second board conduction trace.

11. An integrated circuit pckage configured to be coupled to an automotive Ethernet connection having a first off-package conduction path and a second off-package conduction path the integrated circuit pckage comprising:
    a substrate;
    a firt package conduction trace on the substrate;
    a first off-package conductor coupled to the first pakage conduction trae at a first contact point spaced from an edge of the substrate, and extending over the substrate from the first contact point to the edge of the substrate for connection the first off-package conduction path;
    second package conduction trace; and
    a second off-package conduction path, to the second package conduction trace at a second contact point spaced from the edge of the substrate, and extending over the substrate from the second contact point to the edge of the substrate for connection the second off-package conduction path; wherein:
    one path of (1) the second off-package donduction path, and (2) the first off-package conduction path, is a pwer path and another path of (1) the second off-package conduction path, and (2) the first off-package conduction path, is a signal path; and
    at least one loop in at least one of (a) the first package conduction trace, and (b) the second package conduction trace, is configured to inductively couple the respective one of (a) the first package conduction trace and (b) the second package conduction trace to a respective one of (1) the second off-package conduction path and (2) the first off-package conduction path.

12. The method of claim 11 wherein configuring the at least one loop comprises configuring the loop so that the respective one of (1) the second off-board conduction path, and (2) the first off-board conduction path, crosses the at least one loop in two places.

13. The method of claim 12 wherein configuring the at least one loop comprises configuring the at least one loop so that the respective one of (1) the second off-board conduction path, and (2) the first off-board conduction path, crosses the at least one loop in two places.

14. The method of claim 13 wherein configuring the at least one loop comprises configuring the at least one loop so that the respective one of (1) the second off-board conduction path, and (2) the first off-board conduction path, crosses a center of the at least one loop.

15. The method of claim 12 wherein forming the at least one loop comprises forming a plurality of loops.

16. The method of claim 12 wherein forming the at least one loop comprises forming the at least one loop between (A) a respective one of (i) the first contact point and (ii) the second contact point, and (B) the edge of the printed circuit board.

17. The method of claim 12 wherein: forming the at least one loop in the at least one of (a) the first board conduction trace, and (b) the second board conduction trace, comprises forming the at least one loop in a respective one of (a) the first board conduction trace, and (b) the second board conduction trace.

18. The method of claim 17 wherein:
a first circuit including a first one of (1) the second off-board conduction path, and (2) the first off-board conduction path, is less sensitive to latency than another circuit including another one of (1) the second off-board conduction path and (2) the first off-board conduction path and forming the at least one loop in the respective one of (a) the first board conduction trace, and (b) the the second board conduction trace, comprises forming the at least one loop in the one of (a) the first board conduction trace, and (b) the second board conduction trace, that is coupled to the first circuit.

19. The method of claim 18 wherein forming the at least one loop in the respective one of (a) the first board conduction trace, and (b) the second board conduction trace, comprises forming the at least one loop in the power path.

20. The method of claim 12 wherein: forming the at least one loop in at least one of (a) the first board conduction trace, and (b) the second board conduction trace, comprises forming both (a) a first at least partial loop in the first board conduction trace, and (b) a second at least partial loop in the second board conduction trace.

21. The method of claim 12 wherein:
at least the respective one of (1) the second off-board conduction path, and (2) the first off-board conduction path, in a differential conduction path; and
forming the at least one loop comprises forming a loop in which current flows oppositely to a direction of current flow in a loop formed by legs of the differential conduction path.

* * * * *